(12) United States Patent
Mun

(10) Patent No.: US 11,647,300 B2
(45) Date of Patent: May 9, 2023

(54) METHOD FOR FORMING LED FLICKERING REDUCTION (LFR) FILM FOR HDR IMAGE SENSOR AND IMAGE SENSOR HAVING SAME

(71) Applicant: OMNIVISION TECHNOLOGIES, INC., Santa Clara, CA (US)

(72) Inventor: Seong Yeol Mun, Santa Clara, CA (US)

(73) Assignee: Omnivision Technologies, Inc., Santa Clara, CA (US)

( * ) Notice: Subject to any disclaimer, the term of this patent is extended or adjusted under 35 U.S.C. 154(b) by 199 days.

(21) Appl. No.: 17/247,321

(22) Filed: Dec. 7, 2020

(65) Prior Publication Data
US 2022/0182563 A1    Jun. 9, 2022

(51) Int. Cl.
| | |
|---|---|
| *H04N 25/57* | (2023.01) |
| *H01L 27/146* | (2006.01) |
| *H04N 25/702* | (2023.01) |
| *H04N 25/76* | (2023.01) |
| *H04N 25/13* | (2023.01) |
| *H04N 25/585* | (2023.01) |
| *H04N 25/77* | (2023.01) |

(52) U.S. Cl.
CPC ....... *H04N 25/57* (2023.01); *H01L 27/14603* (2013.01); *H01L 27/14643* (2013.01); *H01L 27/14683* (2013.01); *H04N 25/702* (2023.01); *H04N 25/76* (2023.01)

(58) Field of Classification Search
CPC ...... H04N 5/355; H04N 5/3696; H04N 5/374; H04N 5/35563; H04N 5/3745; H04N 9/04551; H04N 25/57; H04N 25/702; H04N 25/76; H04N 25/13; H04N 25/585; H04N 25/77; H01L 27/14603; H01L 27/14643; H01L 27/14683; H01L 27/1463; H01L 27/14625
See application file for complete search history.

(56) References Cited

U.S. PATENT DOCUMENTS

| | | | |
|---|---|---|---|
| 9,590,005 B1 | 3/2017 | Qian et al. | |
| 2003/0197793 A1* | 10/2003 | Mitsunaga | H04N 9/04561 348/E3.018 |
| 2015/0333099 A1 | 11/2015 | Lyu et al. | |
| 2016/0118438 A1* | 4/2016 | Leung | H01L 27/14623 257/229 |

(Continued)

*Primary Examiner* — Albert H Cutler
(74) *Attorney, Agent, or Firm* — Christensen O'Connor Johnson Kindness PLLC

(57) ABSTRACT

A pixel array for a high definition (HD) image sensor is disclosed. The pixel array includes a number of split pixel cells each including a first photodiode and a second photodiode that is more sensitive to incident light than the first photodiode. The first photodiode can be used to sense bright or high intensity light conditions, while the second photodiode can be used to sense low to medium intensity light conditions. In the disclosed pixel array, the sensitivity of one or more photodiodes is reduced by application of a light attenuation layer over the first photodiode of each split pixel cell. In accordance with methods of the disclosure, the light attenuation layer can be formed prior to the formation of a metal, optical isolation grid structure. This can lead to better control of the thickness and uniformity of light attenuation layer.

22 Claims, 9 Drawing Sheets

(56) References Cited

U.S. PATENT DOCUMENTS

| | | | |
|---|---|---|---|
| 2018/0366513 A1* | 12/2018 | Yang | H01L 27/14621 |
| 2019/0096933 A1* | 3/2019 | Kido | H01L 27/1464 |
| 2021/0143193 A1* | 5/2021 | Takizawa | H01L 27/14645 |
| 2021/0281750 A1* | 9/2021 | Vu | H04N 23/80 |

* cited by examiner

METHOD FOR FORMING LED FLICKERING REDUCTION (LFR) FILM FOR HDR IMAGE SENSOR AND IMAGE SENSOR HAVING SAME

BACKGROUND INFORMATION

Field of the Disclosure

This disclosure relates generally to image sensors, and in particular but not exclusively, relates to image sensors, such as high dynamic range (HDR) image sensors, employing a split pixel design with reduced LED flickering.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Integrated circuit (IC) technologies for image sensors are constantly being improved, especially with the constant demand for higher resolution and lower power consumption. Such improvements frequently involve scaling down device geometries to achieve lower fabrication costs, higher device integration density, higher speeds, and better performance.

But as the miniaturization of image sensors progresses, defects within the image sensor architecture become more readily apparent and may reduce the image quality of the image. For example, excess current leakage within certain regions of the image sensor may cause high dark current, sensor noise, white pixel defects, and the like. These defects may significantly deteriorate the image quality from the image sensor, which may result in reduced yield and higher production costs.

High dynamic range (HDR) image sensors may present other challenges. For example, some HDR image sensor layouts are not space efficient and are difficult to miniaturize to a smaller pitch to achieve higher resolutions. In addition, due to the asymmetric layouts of many of these HDR image sensors, reducing the size and pitch of the pixels to realize high resolution image sensors result in crosstalk or other unwanted side effects, such as diagonal flare that can occur in these image sensors as the pitches are reduced. Furthermore, many HDR image sensors require structures with very large full well capacities (FWC) to accommodate the large dynamic ranges. However, the large FWC requirements cause lag, white pixels (WP), dark current (DC), and other unwanted problems.

Figure 1:
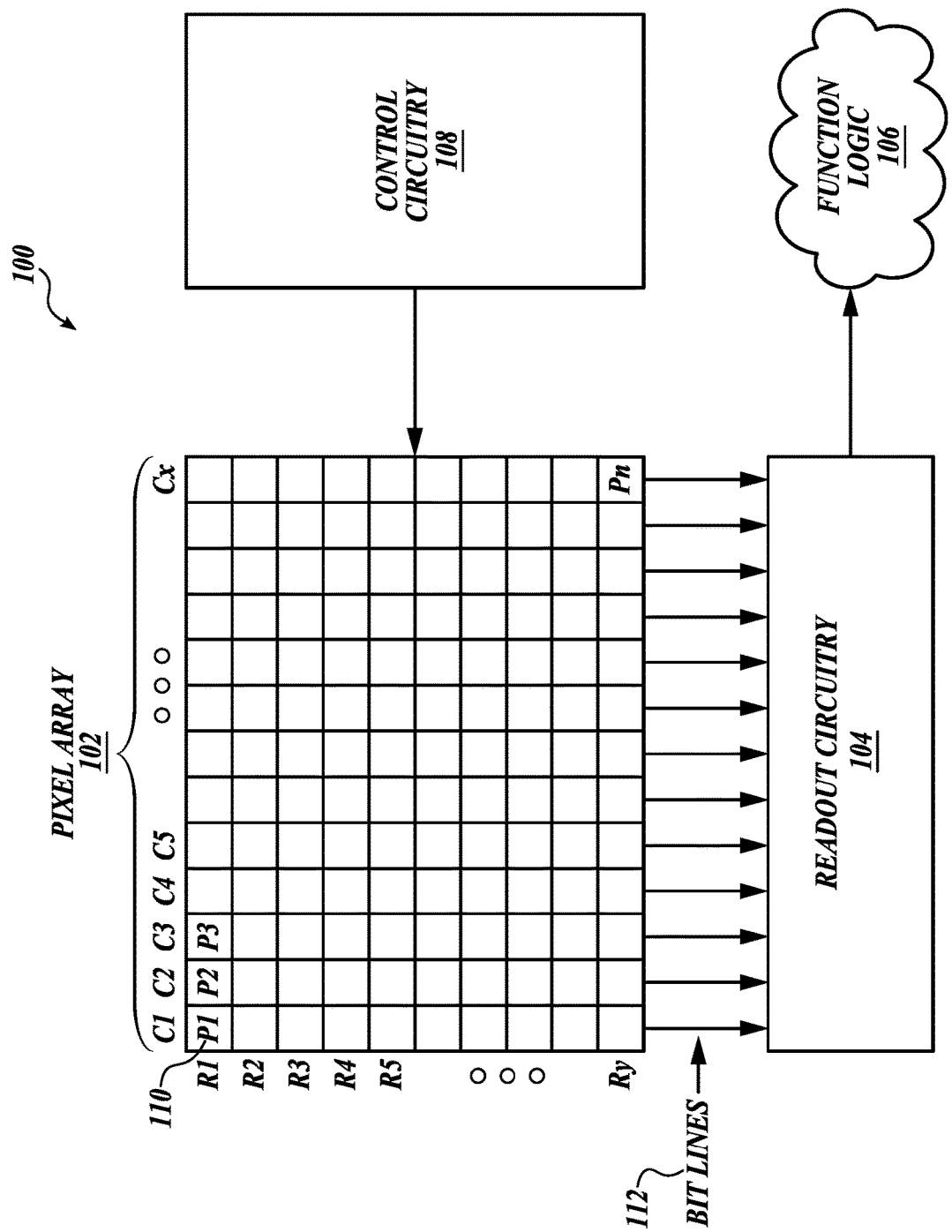
FIG. 1 illustrates one example of an image sensor according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

Examples of an apparatus having a split pixel cell with a light attenuation layer are provided. Methods of fabricating such an apparatus are also provided. Thus, in the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

Additionally, it will also be understood that when a layer is referred to as being "between" two layers, it can be the only layer between the two layers, or one or more intervening layers may also be present. Similarly, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Example embodiments may be described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As will be shown, examples of pixel cells for high dynamic range imaging are disclosed. In various examples, an example split pixel cell includes a number of photodiode regions (e.g., four, nine, sixteen and the like). In an example, at least one photodiode region is configured to form a small photodiode and a number of photodiode regions (e.g., remaining of photodiode regions) surrounding the small photodiode are configured to form a large photodiode. In some examples, the small photodiode can be used to sense bright or high intensity light conditions, while the large photodiode can be used to sense low to medium intensity light conditions. One or more of these example pixel cells can be arranged in a pixel array and utilized, for instance, for high dynamic range imaging. In some examples, the pixel cells of the pixel array can employ 3T, 4T or 5T pixel architectures. In some examples, a shared pixel cell architecture is employed in which the photodiodes are coupled to a common floating diffusion via a number of transfer gates.

In the automotive industry, image sensors are employed for back-up cameras, advanced driver-assistance systems (ADAS), camera-based mirrors, sometimes referred to as E-mirrors, etc. With the prevalence of LED lighting in vehicles, a HDR image sensor having low LED flicker is needed. Generally, LED light, which appears continuous to the human eye, can appear to flicker in images captured by cameras employing HDR image sensors due to the on/off characteristics of the LED light generation. Flickering LED's in images presented by one or more of these systems to a driver may cause driver confusion, driver distraction, etc.

Technology has been presented to address LED flickering in image capture, or others. For example, U.S. Pat. No. 9,590,005 and an US Patent Publication No. 2018/0366513, both assigned to Omnivision Technologies Inc., employ a light attenuation layer that is positioned over the small photodiode of a split pixel cell. The light attenuation layer reduces photodiode sensitivity, which may allow for longer integration times of the small photodiodes, prevent saturation during integration, etc.

However, the continuing request for higher resolution image sensors with low power consumption, leads to ever decreasing pixel size. With decreasing pixel size, light attenuation layer removal from the large photodiodes of the spilt pixel cell becomes more challenging. For example, current processing schemes have difficulty in clearly etching away the light attenuation layer in the narrow spaces in the optical isolation grid that are associated with the large photodiodes. In addition, current processing schemes have difficulty in uniform light attenuation layer deposition between narrowly spaced optical isolation grid structures typically employed by these sensor types.

The methodologies and technologies of the present disclosure seek to address these issues associated with split pixel cells employed, for example, in automotive environments, or others. For instance, examples of the disclosed subject matter aim to reduce LED flicker associated in HDR image sensors by reducing the sensitivity of one or more photodiodes of, for example, a 3T, 4T or 5T pixel cell, including those of a split-pixel design, so that longer integration times, prevention of saturation during integration, etc., for example, can be realized so as to enhance the dynamic range for image sensor. In some examples, the sensitivity of one or more photodiodes is reduced by application of a light attenuation layer over the small photodiode of the split pixel cell. In accordance with methodologies of the present disclosure, the light attenuation layer can be formed prior to the formation of the metal, optical isolation grid structure. By forming the light attenuation layer prior to the formation of the metal, optical isolation grid structure, the light attenuation layer is not formed on the metal, optical isolation grid structure, which could degrade the subsequent lithography process, and the thickness of the light attenuation layer can be better controlled.

As will be described in more detail below, the transistors of the pixel cell in example embodiments may be of the N-channel metal-oxide-semiconductor (NMOS) type, in which the metal may be polycrystalline silicon (poly-Si), tungsten (W) and the like, the oxide may be a dielectric such as $SiO_2$ (e.g., thermally grown or deposited on the semiconductor material), and the semiconductor may correspond to a portion of the semiconductor material, such as silicon (e.g., single crystal or polycrystalline Si), silicon on insulator (SOI), etc.

To illustrate, FIG. 1 illustrates a block diagram illustrating an example image sensor 100 that detects low/medium and high intensity illumination using a pixel array with, for example, split pixel cells in accordance with the technologies and methodologies of the present disclosure. Image sensor 100 may be implemented as complementary metal-oxide-semiconductor ("CMOS") image sensor. As shown in the example illustrated in FIG. 1, image sensor 100 includes pixel array 102 coupled to control circuitry 108 and readout circuitry 104, which is coupled to function logic 106.

The illustrated embodiment of pixel array 102 is a two-dimensional ("2D") array of imaging sensors or pixel cells 110 (e.g., pixel cells P1, P2, ..., Pn). In one example, each pixel cell includes one or more subpixels or pixel regions that can be used for imaging in accordance with technologies and methodologies of the present disclosure. As illustrated, each pixel cell 110 is arranged into a row (e.g., rows R1 to Ry) and a column (e.g., columns C1 to Cx) to acquire image data of a person, place or object, etc., which can then be used to render an image of the person, place or object, etc. As will be described in greater detail below, each pixel cell 110 (e.g., pixel cells P1, P2, ..., Pn) may include, for example, a small photodiode adjacent to one or more large photodiodes, wherein a light attenuation layer is placed over the small photodiode in accordance with technologies and methodologies of the present disclosure.

In one example, after each pixel cell 110 has acquired its image data or image charge, the image data is read out by readout circuitry 104 through readout column bitlines 112 and then transferred to function logic 106. In various examples, readout circuitry 104 may include amplification circuitry (not illustrated), a column readout circuit that includes analog-to-digital conversion (ADC) circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For instance, in one example control circuitry 108 generates the transfer gate signals and other control signals to control the transfer and readout of image data from the subpixels or pixel regions of the shared pixel cell 110 of pixel array 102. In addition, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In one example, the control circuitry 108 may control the timing of various control signals provided to the pixel cell 110 to reduce the dark current associated with floating diffusions of each of the pixel cells 110. The pixel cells 110, in some non-limiting embodiments, may be what are known as 4T pixel cells, e.g., four-transistor pixel cells. In other non-limiting embodiments, the pixel cells 110 may be what are known as 3T pixel cells, e.g., three-transistor pixel cells. In other non-limiting embodiments, the pixel cells 110 may be what are known as 5T pixel cells, e.g., five-transistor pixel cells. In some other non-limiting embodiments, the pixel cells, regardless of transistor numbers, (e.g., 3, 4, 5, etc.) are of the split-pixel type.

In one example, image sensor 100 may be included in a digital camera, cell phone, laptop computer, or the like. Additionally, image sensor 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor 100, extract image data from image sensor 100, or manipulate image data supplied by image sensor 100.

Figure 2:
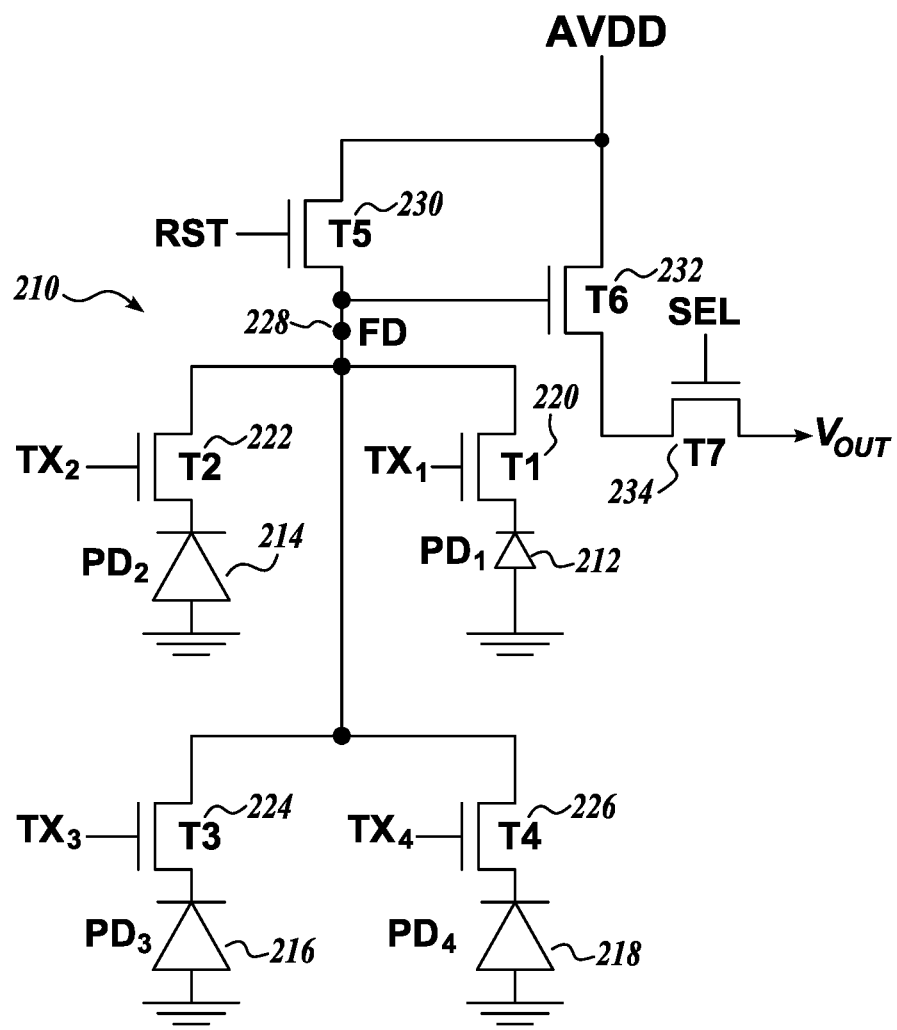
FIG. 2 is an illustrative schematic of one example of a pixel cell in accordance with an embodiment of the present disclosure.

FIG. 2 is an illustrative schematic of an example pixel cell 210 with a split pixel design in accordance with the teachings of the present disclosure. However, it should be appreciated that embodiments of the present disclosure are not limited to the pixel architecture of FIG. 2; rather, one of ordinary skill in the art having the benefit of the instant disclosure will understand that the present teachings are also applicable to 3T designs, 5T designs, shared and non-shared pixel design and various other pixel architectures.

It is appreciated that pixel cell 210 of FIG. 2 may be an example of a pixel cell 110 of FIG. 1, and that similarly named and numbered elements referenced below may be coupled and function similar to as described above. For example, the pixel cell 210 may be coupled to a bitline, e.g., readout column, which may provide image data to readout circuitry, such as the readout circuitry 104, and the pixel cell 210 may receive control signals from control circuitry, such as control circuitry 108, to control the operation of the various transistors of the pixel cell 210. The control circuitry 108 may control the operation of the transistors in desired sequences with relative timing in order to reset the pixel to a dark state, for example, and to read out image data after an integration, for example.

The illustrated example of the pixel cell 210 includes a first photoelectric conversion element or photodiode region 212, such as a small photodiode (PD1), and a number (shown as three) of second photoelectric conversion elements or photodiode regions 214, 216, 218, which collectively form a large photodiode (PD2-PD4). The illustrated example of the pixel cell 210 may be referred as a 4C pixel cell. In operation, the small photodiode (PD1) and the large photodiode (PD2-PD4) are coupled to photogenerate image charge in response to incident light. In an embodiment, the large and small photodiodes can be used to provide image data for a high dynamic range (HDR) image. For example, the small photodiode (PD1) can be used to sense bright or high intensity light conditions, while the large photodiode (PD2-PD4) can be used to sense dimmer low to medium intensity light conditions to provide image data for a high dynamic range (HDR) image.

In an example embodiment, the large photodiode, collectively formed by photodiode regions 214, 216, 218, have a larger light exposure area than the light exposure area of the small photodiode (e.g., photodiode region 212). In another example embodiment, the small photodiode has a smaller full well capacity (FWC) than the large photodiode (e.g., the combined full well capacity of photodiode regions 214, 216, 218). In another example embodiment, the small photodiode includes a short integration, and the large photodiode include a long integration. In another example embodiment, the large photodiode include a long integration and the small photodiode includes an even longer integration to ensure, for example, LED capture in every frame.

In one example embodiment, as will be described in more detail below, an LED flickering reduction (LFR) film, or light attenuation layer, is disposed solely over the small photodiode ($PD_1$) to desensitize the small photodiode ($PD_1$) while the sensitivity of the large photodiode ($PD_{2-4}$) remains unchanged. As a result, the photodiode regions 214, 216, 218 of large photodiode have higher sensitivity to incident light and can be therefore utilized for lower light intensity sensing. Since the small photodiode ($PD_1$) on the other hand has, for example, less light exposure area, a smaller FWC, or the like, and since there is a light attenuation layer disposed over the small photodiode ($PD_1$), it is less sensitive to high intensity light compared to the large photodiodes ($PD_{2-4}$) and is therefore utilized for higher light intensity sensing. By utilizing both large and small photodiodes in a pixel cell 210, HDR imaging sensing is realized. As will be described in more detail below, the desensitized small photodiode can lead to increased integration times before saturation, for example.

Pixel cell 210 also includes a first transfer gate 220 of a first transfer transistor associated with the small photodiode 212, second-fourth transfer gates 222, 224, 226 of a second, third and fourth transfer transistors associated with the photodiodes 214, 216, 218, respectively, of the large photodiode, and a floating diffusion (FD) 228. First transfer gate 220 is coupled to transfer image charge from small photodiode 212 to the floating diffusion 228 in response to a control signal $TX_1$. Second, third and fourth transfer gates 222, 224, 226 are coupled to transfer image charge from respective large photodiodes 214, 216, 218 to the floating diffusion 228 in response to control signals $TX_2$, $TX_3$, $TX_4$. In the depicted arrangement, the floating diffusion 228 is common to the photodiodes 212, 214, 216, 218 and can be referred to as a common floating diffusion 228.

A reset transistor 230 is coupled to the common floating diffusion 228 to reset the pixel cell 210 (e.g., discharge or charge the photodiode regions 212, 214, 216, 218 and the floating diffusion 228 to a preset voltage) in response to a reset signal RST. The gate terminal of an amplifier transistor 232 is also coupled to the floating diffusion 228 to generate an image data signal in response to the image charge in the floating diffusion 228. In the illustrated example, the amplifier transistor 232 is coupled as a source-follower (SF) coupled transistor. A row select transistor 234 is coupled to the amplifier transistor SF 232 to output the image data signal to an output bitline, which is coupled to readout circuitry such as readout circuitry 104 of FIG. 1, in response to a row select signal SEL.

Control signals $TX_1$ and $TX_{2-4}$ enable the transfer gates 220, 222, 224, 226, to transfer the charges from the photodiode regions 212, 214, 216, 218 to the common floating diffusion 228. The amount of charge transferred from the photodiodes to the floating diffusion 228 may depend on a current operation of the pixel cell 210. For example, during a reset operation, the charge may be charge generated in a dark state of the photodiode(s), but during an integration, the charge may be photogenerated image charge. At the end of an integration, the image charge may be readout twice with one or more dark readings occurring between the two to perform correlated double sampling (CDS).

Figure 3:
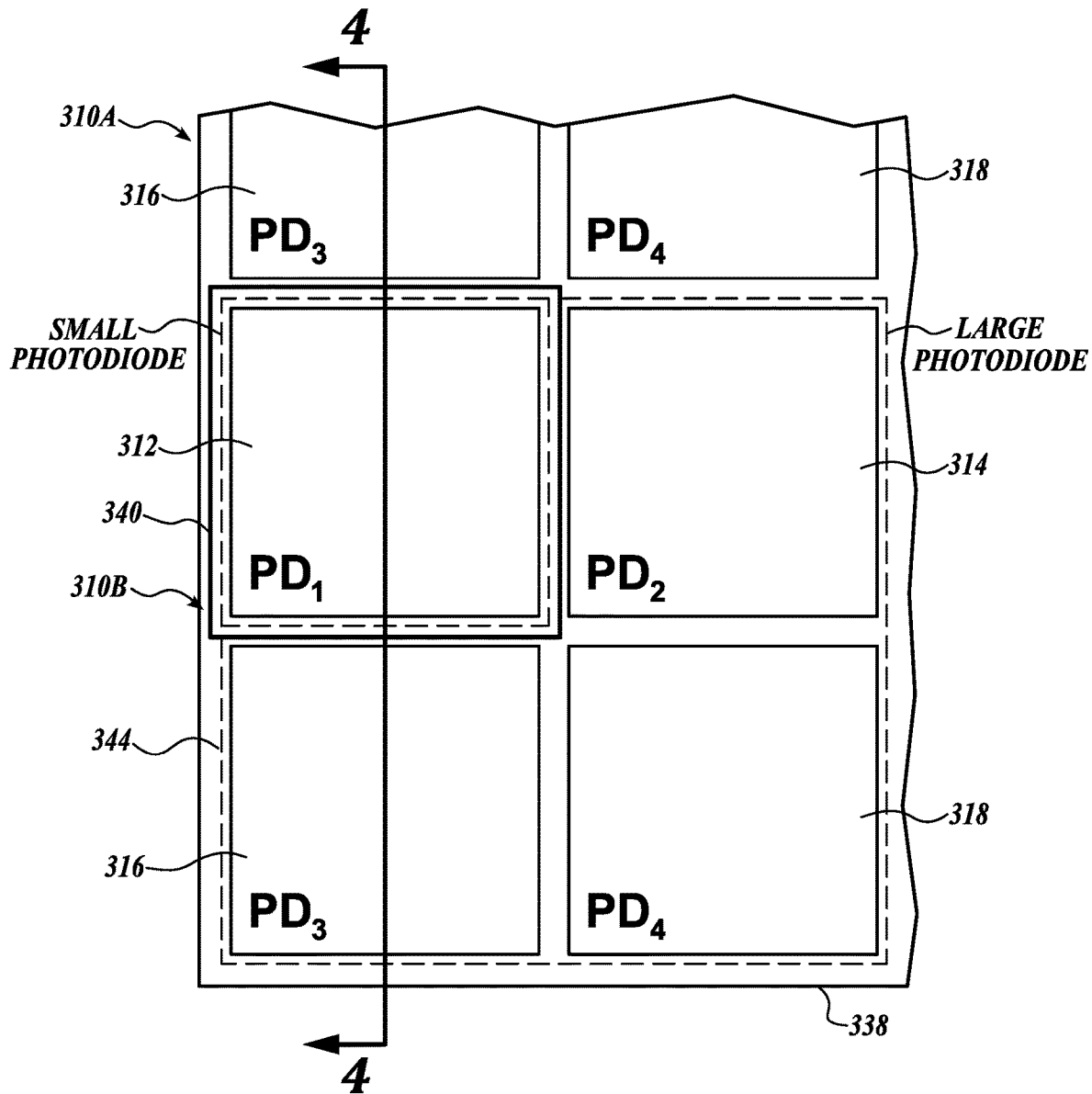
FIG. 3 is a top schematic partial view of one example of a pixel array in accordance with an embodiment of the present disclosure.

FIG. 3 is a layout schematic view, or top schematic view, of a portion of an example pixel array 302 comprising one or more pixel cells 310A-310N in accordance with technologies and methodologies of the present disclosure. It is appreciated that the pixel cells 310 of FIG. 3 may be examples of pixel cell 210 of FIG. 2, or examples of pixel cell 110 of FIG. 1, and that similarly named and numbered elements referenced below may be coupled and function similar to as described above.

For brevity and clarity, pixel cell 310B of the pixel array 302 will now be described in more detail. It will be appreciated that the other pixel cells 310 of the pixel array 302 are constructed substantially identical to pixel cell 310B, and thus, will not be separately described.

In the example embodiment of FIG. 3, the pixel cell 310B includes a first photodiode region 312 configured to form a small photodiode adjacent a number of photodiode regions 314, 316, 318 configured to collectively form a large photodiode. As such, a pixel array, such as pixel array 302, includes a semiconductor substrate 338 having a plurality of small photodiodes, such as photodiode regions 312, each of which is surrounded by a plurality of photodiodes regions 314, 316, 318 of a large photodiode. Each photodiode of the pixel cell is adapted to photogenerate image charge in response to incident light. Of course, the pixel cell 310B, or the pixel array 302, may have other photodiode layouts in accordance with embodiments of the disclosure. Embodiments of the pixel cell 310 that include more than one photodiode or subpixel region "share" the pixel transistor region (not shown) of the pixel cell 310B, and thus, can be referred to as a shared pixel cell.

In the example illustrated, the photodiode regions 314, 316, 318 of a large photodiode (for brevity refer as large photodiode regions 314, 316, 18) have greater sensitivity to incident light than photodiode region 312 of a small photodiode (for brevity refer as small photodiode regions 312). For example, in the example depicted in FIG. 3, a light attenuation layer 340, such as a metal film layer (e.g., Ti/TiN stack), is disposed over a surface of the semiconductor substrate 338. In an example embodiment, the light attenuation layer 340 is optically aligned with small photodiode region 312, so that it blocks or attenuates some of the incoming incident light directed onto the small photodiode region 312. For example, it is appreciated that with light attenuation layer 340 disposed along the optical path of incident light 368 (FIG. 4) to the small photodiode regions 312 of the pixel cell 310, the light sensitivity of the small photodiode regions 312 is further reduced. Reducing light sensitivity of the small photodiode by attenuating the incoming incident light can prevent the small photodiodes from saturation during integration. Prevention of saturation during integration can lead to longer integration times, which can address, for example, the LED flickering issue.

In one example embodiment, the light absorption of small photodiode regions 312 can be reduced, for example, up to 10 times or more with light attenuation layer 340. The transmittance of the incident light 368 (FIG. 4) through the light attenuation layer 340 is responsive to a thickness of the light attenuation layer 340. Therefore, the transmittance of the incident light into the small photodiode regions 312 may be adjusted by controlling the thickness of the light attenuation layer 340. Indeed, the final thickness of the light attenuation layer 340 may be selected based on a transparency vs. thickness plot. As will be described in more detail below, thickness of the light attenuation layer 340 can be better controlled via methods of the present disclosure.

The pixel array 302 also includes an optical isolation grid structure 344, such as a light barrier grid, disposed adjacent the plurality of photodiodes of the semiconductor substrate 338 in accordance with the teachings of the present disclosure. The optical isolation grid structure 344 defines a plurality of openings that are disposed over the photodiodes of the semiconductor substrate 338. In one example, the optical isolation grid structure 344 may be comprised of aluminum, titanium nitride, or another other suitable material to fabricate a metal grid to direct incident light 368 (FIG. 4) through the plurality of openings into the respective photodiodes in semiconductor substrate 338.

As will be described in more detail below, the optical isolation grid structure 344 is placed between adjacent color filters (not shown) to suppress transmission of light between adjacent color filters. It will be appreciated that in the absence of optical isolation grid structure 344, light from a scene may enter one color filter associated with one subpixel of pixel array 302 and propagate to an adjacent color filter prior to reaching the light-receiving surface of the photodiodes. This process causes crosstalk (such as optical crosstalk) between adjacent subpixels. The optical isolation grid structure 344 is thus provided to serve to suppress such crosstalk to provide improved color clarity and resolution in general.

As will be described in more detail below, a variety of materials and fabrication techniques may be utilized to form the pixel array 302. The semiconductor substrate 338 may have a composition of Si (e.g., single crystal or polycrystalline Si). The gates may have a composition including tungsten or polycrystalline silicon. Dielectric layers (not shown) may have a composition of $SiO_2$, $HfO_2$, or any other suitable dielectric medium known by one of ordinary skill in the art. Contacts may be constructed of any doped material with low ohmic resistance. Other metals, semiconductors, and insulating materials may also be utilized for pixel array 302, as known by one of ordinary skill in the art. Doped regions of the semiconductor material may be formed by implantation, thermal diffusion, and the like. It will be appreciated that the doping polarities or doping types (P-type, N-type, etc.) in the illustrative embodiments may be reversed in alternative embodiments. Fabrication techniques such as photolithography, masking, chemical etching, ion implantation, thermal evaporation, plasma vapor deposition, chemical vapor deposition, atomic layer deposition, sputtering, and the like, as known by one of ordinary skill in the art, may be utilized to fabricate the pixel cell 310, the pixel array 302, and/or the image sensor 100.

Figure 4:
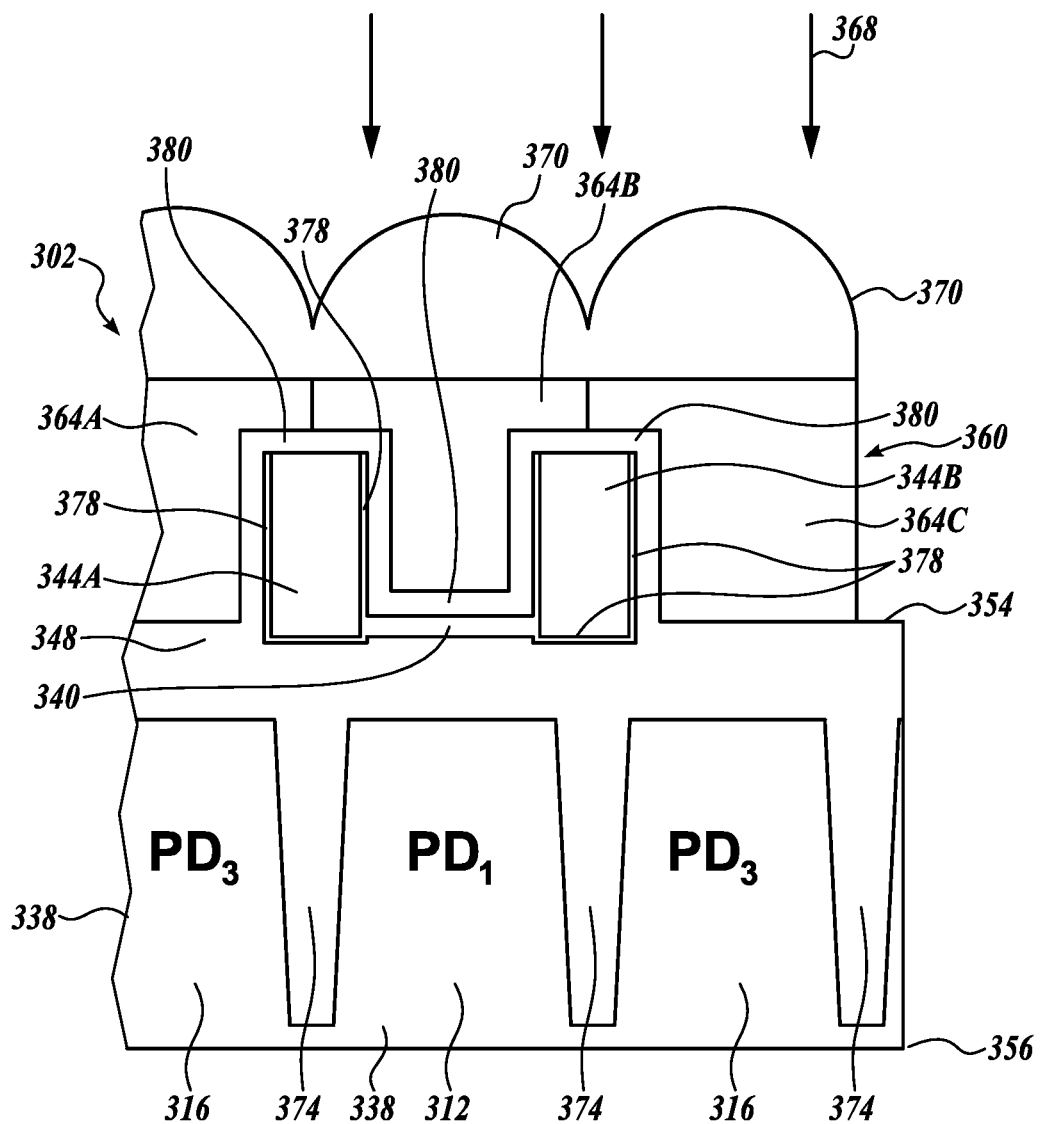
FIG. 4 is schematic cross sectional view of the pixel array of FIG. 3, taken along lines 4-4.

FIG. 4 is a partial cross-section view of a pixel array, such as pixel array 302, taken along lines 4-4 of FIG. 3. The pixel array 302 is comprised of a plurality of pixel cells, such as pixel cells 310, arranged in rows and columns. It is appreciated that pixel array 302 is provided for explanation purposes and therefore represents just one possible cross-section illustration for implementing a pixel array, and that examples in accordance with the teachings of the present disclosure are not limited to the specific pixel array cross-section illustration example as shown.

In the embodiment illustrated in FIG. 4, the pixel array 302 includes a semiconductor substrate 338 having a first or light-receiving surface 354 (e.g., back side 354) and an opposite, second surface 356 (e.g., front side 356). A color filter layer 360 is disposed on the light-receiving surface 354 of the semiconductor substrate 338. The semiconductor substrate 338 includes an array of photodiodes (PD), each of which generates electrical charge in response to incident light 368. In an example embodiment, color filter layer 360 includes an array of color filters 364, shown as color filters 364A, 364B, 364C, separated by the optical isolation grid structure 344, shown as grid sections 344A, 344B. The array of color filters 364 can be registered to the array of photodiodes (PD), such that each color filter 364 cooperates with a corresponding photodiode to form a color subpixel, i.e., a subpixel that is sensitive to light in a certain wavelength range.

The array of photodiodes (PD) includes a small photodiode ($PD_1$), formed by photodiode region 312, disposed adjacent to one or more photodiode regions 316 of a respective adjacent large photodiode. In an example embodiment, the photodiode regions 316 of large photodiodes are in a surrounding relationship with regard to the photodiode region 312 of a small photodiode. In the example illustrated, the large photodiode regions 316 have greater sensitivity to incident light than small photodiode region 312.

In the embodiment depicted in FIG. 4, each photodiode region 312, 316 is separated at least in part by trench isolation structure, such as deep trench isolation (DTI) structure 374. Deep trench isolation structure 374 is disposed within trenches formed in the backside or light-receiving surface 354 of the semiconductor substrate 338. The deep trench isolation structure 374 can be used to electrically and/or optically isolate the photodiodes, by reflecting light back into the photodiode, and preventing charge from traveling through, and on the surfaces of, semiconductor substrate 338 into other photodiodes, for example.

In an example embodiment, the deep trench isolation structure 374 includes a dielectric fill material (e.g., silicon oxide) that is deposited into trenches formed in the semiconductor substrate 338. In some embodiments, a dielectric layer (not shown) lining the sides and bottom of the trenches may be provided. For example, a high-k liner oxide or the like (e.g., hafnium oxide, silicon oxide, etc.) can create an interface between the deposited dielectric fill material (e.g., silicon oxide) and the photodiode regions 312, 316, etc. In some example embodiments, the deep trench isolation structure 374 may instead include a metal core, which is surrounded by the high-k liner oxide.

In the embodiment depicted in FIG. 4, a passivation layer 348 may be provided over the deep trench isolation structure 374 and proximate the light-receiving surface 354 of the semiconductor substrate 338. The color filter layer 360 is also disposed proximate the light-receiving surface 354 of the semiconductor substrate 338 and interfaces with the passivation layer 348. The passivation layer 348 may be, for example, a silicon oxide film layer or the like. In example embodiments, pixel array 302 further includes an array of micro lenses 370 disposed on color filter array 360 to aid in focusing incident light 368 on the photodiodes.

As was briefly described above, the pixel array 302 further includes optical isolation grid structure 344, shown as grid sections 344A, 344B, disposed above the passivation layer 348 and separating the color filter array 360 into color filters 364A, 364B, 364C. The optical isolation grid structure 344 may, for example, include a reflective material, such as a metal, which may reflect light into the proper photodiode. For example, in one example embodiment, the optical isolation grid structure 344 may be comprised of aluminum, titanium nitride, or another other suitable material to fabricate a metal grid to direct incident light 368 into the respective photodiodes in semiconductor substrate 338. In some embodiments, the optical isolation grid structure 344 is in general alignment (e.g., vertically aligned) with the deep trench isolation structure 374. In the embodiment illustrated, the optical isolation grid structure 344 is in substantial alignment (e.g., in optical alignment) with the deep trench isolation structure 374. In some example embodiments, optical isolation grid structure 344 can be formed in a self-aligned process. In some embodiment, each grid section 344A, 344B of optical isolation grid structure 344 is vertically aligned with the corresponding deep trench isolation structure 374.

In accordance with an aspect of the present disclosure, the pixel array 302 further includes a light attenuation layer 340 that is optically aligned solely with the small photodiode region 312 and in-between grid sections 344A, 344B of the optical isolation grid structure 344 so that it blocks or attenuates some of the incoming incident light 368 into small photodiode region 312, thereby desensitizing the small photodiode region 312. To be clear, the light attenuation layer 340 only covers the light exposure area of the small photodiode regions 312 of the pixel array 302 and does not cover the adjacent large photodiode (i.e., the light attenuation layer 340 does not cover photodiode regions 314, 316, 318 (See also FIG. 3)) of the pixel array 302 reducing light intensity received by small photodiodes.

In the example depicted in FIG. 4, the light attenuation layer 340 is disposed between the color filter 364B and the passivation layer (e.g., oxide layer) 348, and abuts against (e.g., directly adjacent) with the inner walls of the grid sections 344A, 344B of optical isolation grid structure 344. In one example embodiment, the light attenuation layer 340 may be comprised of aluminum, tungsten, titanium, titanium nitride, combinations thereof, such as Ti/TiN, or another suitable thin metal layer film to adjust the transmittance of the incident light 368 in accordance with the teachings of the present disclosure.

In an example embodiment, the bottoms of each grid section associated with small photodiode regions 312, such as grid sections 334A, 344B, are aligned (e.g., level, flush, etc.) with the light attenuation layer 340, which can provide, for example, improved optical performance (e.g., better shield to large incident angle, etc.). In embodiments, grid sections 334A, 344B disposed above the photodiode regions 312, 314, 216, 318 and enclose the light exposure area of the small photodiode region 312. In another example embodiment, the optical isolation grid structure 344 and the light attenuation layer 340 are structurally connected for every pixel due to an example formation method, as will be described in more detail below, and thus can be shifted together when considering the chief ray angle of the pixels.

The pixel array 302 further includes barrier film 378, such as a titanium nitride film, disposed directly on the sidewall surfaces of the grid sections 344A, 344B of optical isolation grid structure 344. In an example embodiment, the barrier film 378 is disposed directly on the entirety of the inner and outer sidewall surfaces of the grid sections 344A, 344B of optical isolation grid structure 344. In the embodiment illustrated, the barrier film 378 is also disposed directly between the bottom surfaces of the grid sections 344A, 344B and the light-receiving surface 354 (e.g., passivation layer 348) of the semiconductor substrate 338. Alternatively, in some example embodiments, the light attenuation layer 340 can be formed before the optical isolation grid structure 344, and thus, the light attenuation layer 340, instead of the barrier film 378, can extend under and directly contact the bottom surfaces of the grid sections 344A, 344B.

In an example embodiment, the thickness of the barrier film 378 is approximately one half the thickness of the light attenuating layer 340. In an example embodiment, neither the barrier film 378 nor the light attenuating layer 340 is formed on or otherwise in direct contact with the outer (e.g., incident light) facing surface of the optical isolation structure 344. Such an absence of the barrier film 378 or light attenuation layer 340 on the top of grid sections 344A, 344B, enables the optical isolation grid structure 344 to have substantially flat top surfaces, improves any subsequent lithography process during fabrication of the pixel cell 310.

An oxide layer 380 in some example embodiments encloses the top (e.g., incident light facing) surface, for example the entire top surfaces, of the optical isolation grid structure 344 for providing isolation between grid sections 344A, 344B of the optical isolation grid structure 344 and the color filters 364 of the color filter array 360. In the example depicted in FIG. 4, the oxide layer 380 is also formed over the other portions of the optical isolation grid structure 344, including the barrier film 378, and is formed over the light attenuation layer 340. In some example embodiments, the oxide layer 380 may also be formed over the passivation layer 348 in order to increase the thickness of the buffer between the color filter array 360 and the semiconductor substrate 338.

The pixel array 302 may further include electrical connections (not shown) connecting the large and small photodiodes to readout electronics, such as readout circuitry 104. Electrical connections are on the side of photodiodes opposite light-receiving surface 354, such that incident light 368 propagating toward photodiodes from a scene does not pass through the layer of electrical connections.

In the example illustrated in FIG. 4, the photodiode regions $PD_1$, $PD_3$ are formed on the back side of the semiconductor substrate 338, and thus, the pixel array 302 can be referred to as a backside-illuminated (BSI) pixel array. While examples have been described herein with regard to a backside—illuminated (BSI) pixel cell or pixel array of an image sensor, methodologies and technologies of the present disclosure may be employed just the same in frontside-illuminated (FBI) pixel cells or pixel arrays of image sensors, etc.

Figure 5:
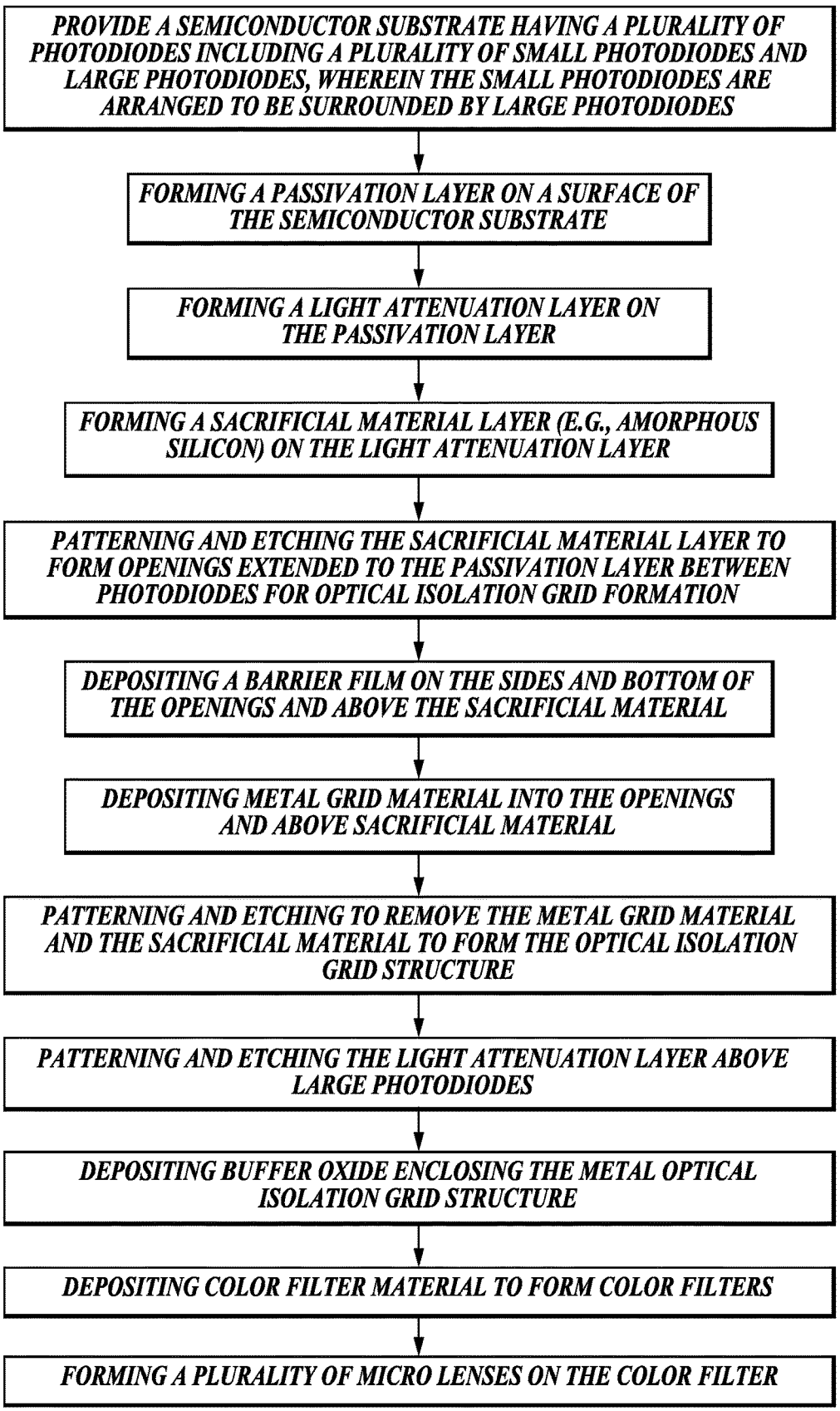
FIG. 5 is an example flow chart for fabricating the pixel array of FIG. 3 in accordance with an embodiment of the present disclosure.

FIG. 5 is a flow chart illustrating one example of a method for fabricating a pixel array, such as pixel array 302, in accordance with the teachings of the present disclosure. It will be appreciated that the following method steps can be carried out in any order or at the same time, unless an order is set forth in an express manner or understood in view of the context of the various operation(s). Additional process steps can also be carried out, including chemical-mechanical polishing, masking, additional doping, etc. Of course, some of the method steps can be combined or omitted in example embodiments. To aid in describing one or steps of the method set forth in FIG. 5, reference will be made to FIGS. 6A-6H.

At the beginning of the fabrication process, a semiconductor substrate, such as semiconductor substrate 338, is provided having a plurality of first photodiodes, such as small photodiode regions 312, and a plurality of second photodiodes, such as large photodiodes collectively formed by photodiode regions 314, 316, 318. In some example embodiments, the first photodiodes provided with the semiconductor substrate are arranged to be surrounded by regions of the second photodiodes. In an example embodiment, the first plurality of photodiodes (e.g., small photodiodes) have less sensitivity to incident light than the second plurality of photodiodes (e.g., large photodiodes).

Figure 6A:
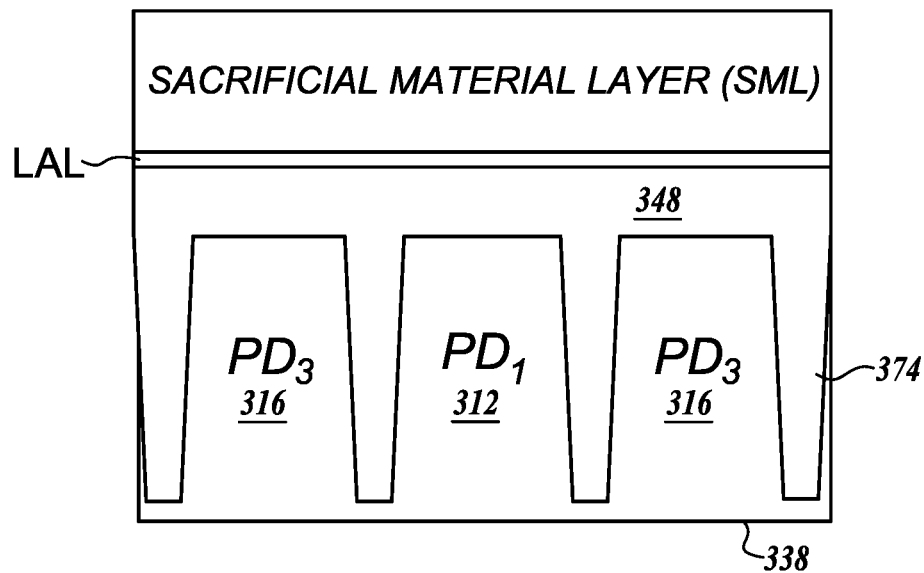
FIGS. 6A-6H are schematic partial views of a pixel array according to one fabrication process, such as the fabrication process of FIG. 5.

A passivation layer (e.g., planarized layer) can then be formed on a surface of the semiconductor substrate 338. In an example embodiment, the passivation layer, such as passivation layer 348, is formed on the backside of the semiconductor substrate 338 and over the plurality of first and second photodiodes. The passivation layer is formed of oxide material such as silicon oxide. Once the passivation layer 348 is formed, a light attenuation layer (LAL), is formed on the passivation layer, as shown in FIG. 6A. In some example embodiments, the light attenuation layer LAL may be single or multi-layer stack and includes a material or materials selected from aluminum, tungsten, titanium, titanium nitride, etc. In an embodiment, the light attenuation layer is formed as a Titanium/Titanium Nitride stack. Because the light attenuation layer LAL is formed directly on the flat passivation layer 348, the thickness of the light attenuation layer LAL can be controlled and can be more uniformly deposited.

Figure 6B:
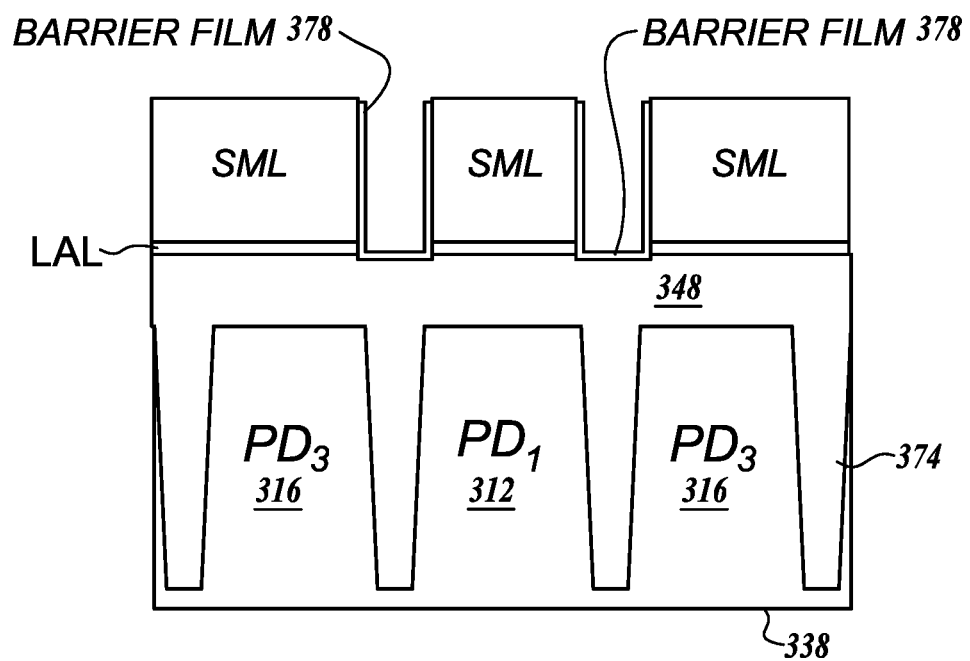

A sacrificial material layer SML (e.g., amorphous silicon) is deposited on the light attenuation layer LAL, as shown in FIG. 6A, which is then patterned and etched to form openings that extend directly adjacent the passivation layer 348 between the plurality of first and second photodiodes, as shown in FIG. 6B. In another example embodiment, the openings extend into the passivation layer 348 a depth so that the bottom of the opening is beneath the light attenuation layer LAL. In an alternative embodiment, the openings extend into the light attenuation layer LAL but not fully so as to not reveal the passivation layer 348. Amorphous silicon can be advantageously employed since it exhibits a high etch selectivity rate compared with silicon oxide. In an example embodiment, the amorphous silicon is deposited at a low temperature, about 390 degrees Celsius, such that the step would not cause damage to already formed structure, for example, metal interconnection structure, negative charges inherent in the high k liner oxide, or the like.

In example embodiments, the openings are also disposed over deep trench isolation trench structure, such as deep trench isolation trench structure 374, that can be provided with the semiconductor substrate 338 prior to the deposition of the passivation layer. As will be described in more detail below, the openings formed in the passivation layer will be subsequently used for optical isolation grid formation.

Next, a barrier film, such as barrier film 378, is deposited on the sidewalls of the openings formed in the previous process, as shown in FIG. 6B. In example embodiments where the openings extend to the passivation layer, the barrier film is also deposited on the bottom of the openings (e.g., directly on the passivation layer). In an example embodiment, the barrier film is non-silicon based film, such as a titanium nitride film. Similar to the amorphous silicon, titanium nitride (TiN) can be advantageously employed since it exhibits a high etch selectivity rate compared with silicon oxide. In an example embodiment, the barrier film is deposited such that its thickness is less than or equal to about one half (½) the thickness of the light attenuation layer.

Figure 6C:
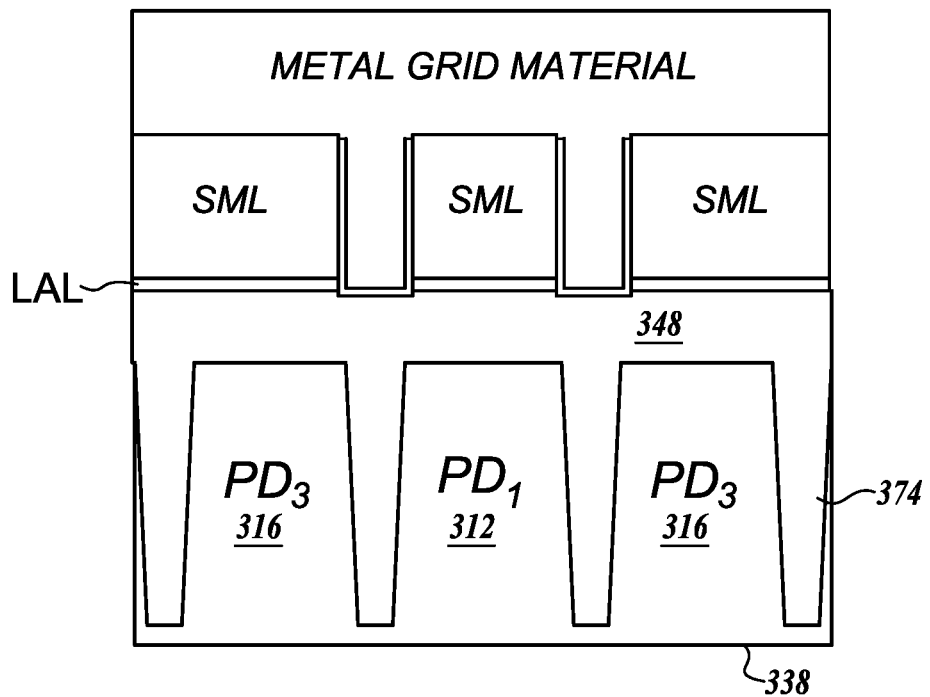

A metal grid material, such as tungsten, etc., is then deposited into the openings, as shown in FIG. 6C. The metal grid material is also deposited so as to cover any exposed sacrificial material. After metal grid material deposition, chemical-mechanical polishing can be carried out to the deposited metal grid material.

Figure 6D:
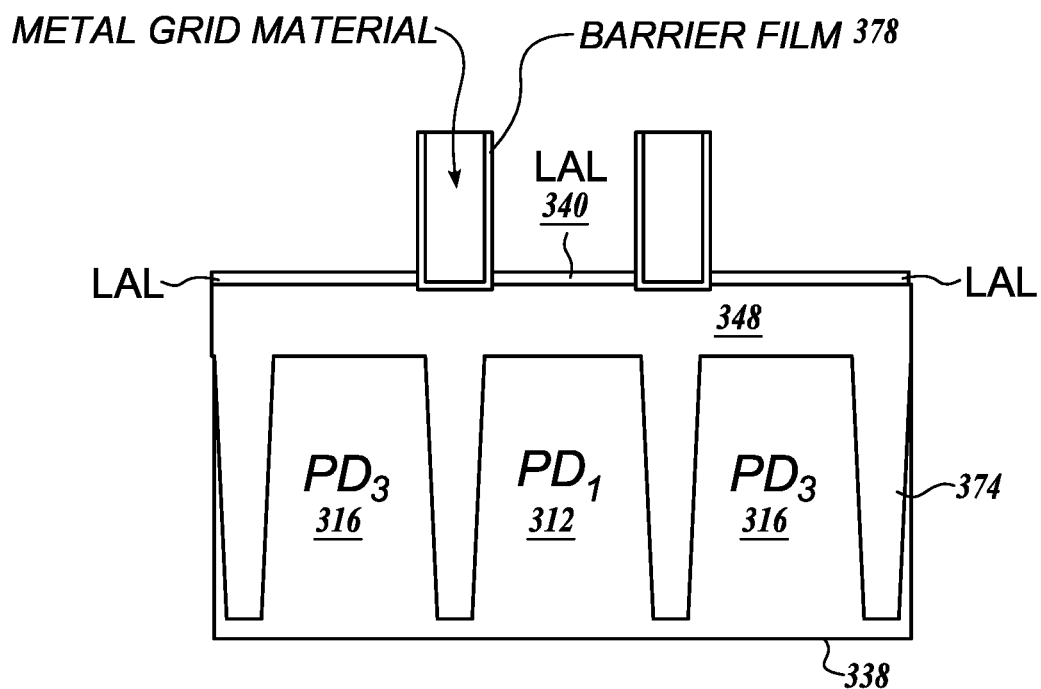

The fabrication method further comprises a patterning and etching process of the metal grid material to form the optical isolation barrier grid structure, such as optical isolation barrier grid structure 344. For example, the process first removes the metal grid material to the level (e.g., height) of the sacrificial material. The process then removes the sacrificial material to expose both the light attenuation layer and the barrier film (on the inner and outer sidewalls of the metal grid material), as shown in FIG. 6D. In an example embodiment, ammonium hydroxide ($NH_4OH$) can be used in the sacrificial material removal process. In an example embodiment, since the light attenuation layer LAL is deposited first, the optical isolation grid structure can be formed in a self-aligned process. As a result of the example method, the optical isolation grid structure and the light attenuation layer are structurally connected. In an example, the optical isolation grid structure and the light attenuation layer may be shifted together depending on pixel location in the pixel array in consideration of the chief ray angle.

Figure 6E:
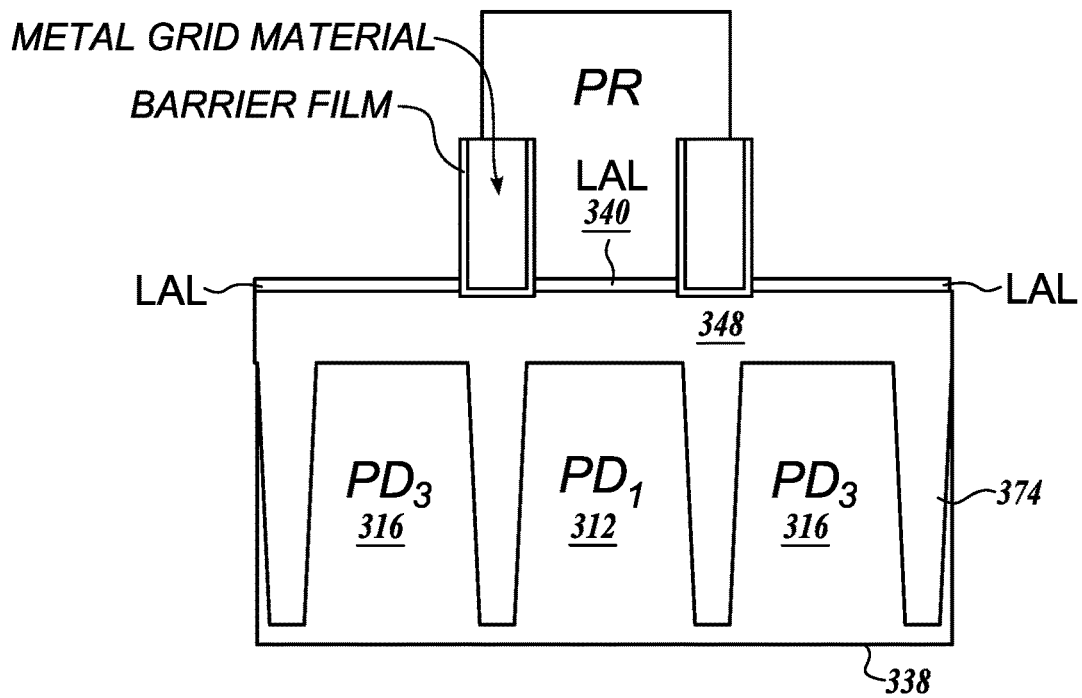
Figure 6F:
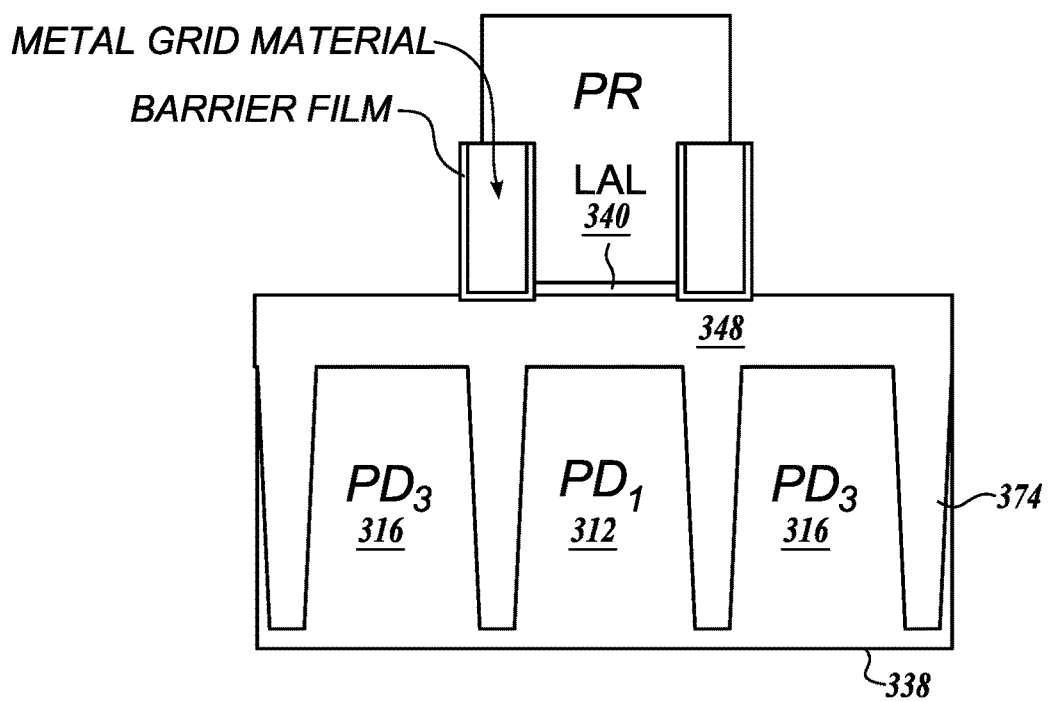

Once the sacrificial material is removed to expose the light attenuation layer LAL, for example by photoresist and etching process, those portions of the light attenuation layer disposed above the regions of the second photodiodes (e.g., large photodiodes) are removed, as shown in FIG. 6F. Of course, a photoresist PR can be used to protect the light attenuation layer (e.g., light attenuation layer 340) that is disposed over the plurality of first photodiodes (e.g., small photodiodes), as shown in FIG. 6E.

Figure 6G:
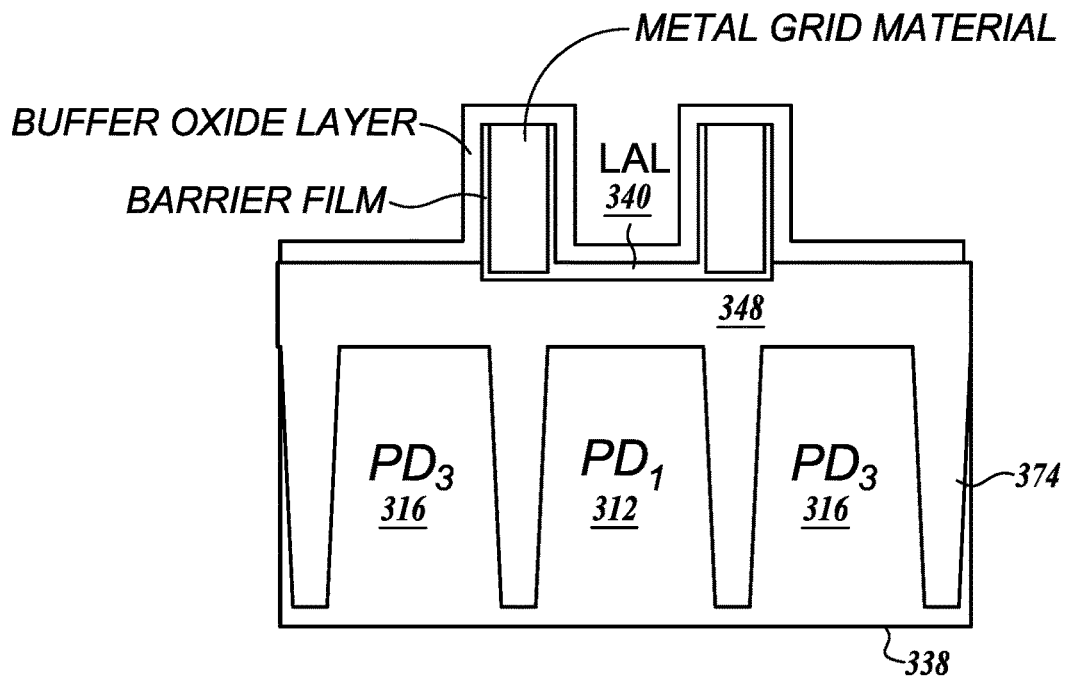
Figure 6H:
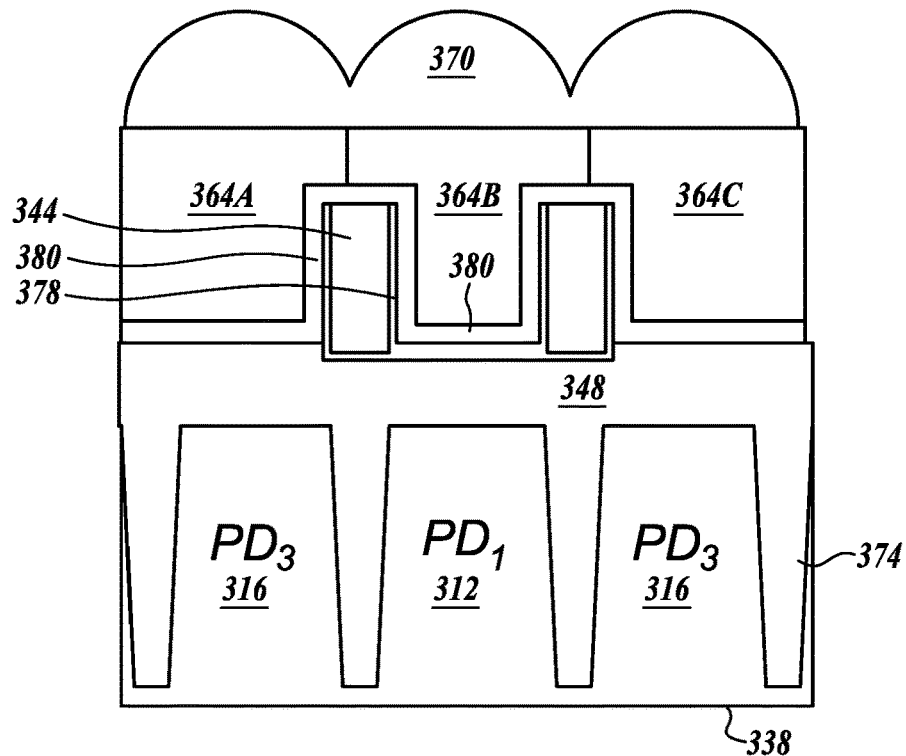

The method can also include other process steps. For example, additional dielectric buffer layer, such as oxide layer 380, can be formed to enclose the exposed surfaces of the metal grid material, such as optical isolation grid structure 344, as shown in FIG. 6G. This includes formation of additional buffer oxide layer on the sidewalls of the optical isolation grid structure directly over the barrier film 378. The additional buffer oxide layer is also formed over the light attenuation layer 340 that remains (i.e., the light attenuation layer over the small photodiodes). In some example embodiments, the buffer layer may also be formed over the passivation layer 348 and couple to the passivation layer 348 in order to increase the buffer thickness between the photodiodes and other structure of the pixel cell. Other process steps, such as color filter array formation and micro lens formation can be carried out, the results of which is shown in FIG. 6H. In some example embodiments, the buffer layer and the passivation layer may be formed of same material e.g., silicon dioxide.

The present application may reference quantities and numbers. Unless specifically stated, such quantities and numbers are not to be considered restrictive, but exemplary of the possible quantities or numbers associated with the present application. Further in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed. And as used herein the term "and/or" includes any and all combinations of one or more of the associated listed items.

The above description of illustrated examples of the present disclosure, including what is described in the Abstract, are not intended to be exhaustive or to be a limitation to the precise forms disclosed. While specific embodiments of, and examples for, the present disclosure are described herein for illustrative purposes, various equivalent modifications are possible without departing from the broader spirit and scope of the present disclosure, as claimed. Indeed, it is appreciated that the specific example voltages, currents, frequencies, power range values, times, etc., are provided for explanation purposes and that other values may also be employed in other embodiments and examples in accordance with the teachings of the present disclosure.

These modifications can be made to examples of the disclosed subject matter in light of the above detailed description. The terms used in the following claims should not be construed to limit the claimed subject matter to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A split pixel cell, comprising:
a semiconductor substrate having a light receiving surface;
a first photodiode disposed in the semiconductor substrate and capable of photogenerating image charge in response to incident light;
a second photodiode disposed in the semiconductor substrate adjacent the first photodiode, the second photodiode capable of photogenerating image charge in response to the incident light, wherein the second photodiode is more sensitive to the incident light than the first photodiode;
a first and a second optical isolation grid sections disposed on the light receiving surface of the semiconductor substrate enclosing a light exposure area of the first photodiode, the first and the second optical isolation grid sections having top surfaces that face the incident light, and inner and outer sidewalls;
a light attenuation layer disposed adjacent to the inner sidewalls of the first and the second optical isolation grid sections and in optical alignment with the first photodiode, wherein the light attenuation layer is structurally connected with the first and the second optical isolation grid sections covering the light exposure area of the first photodiode; and
a barrier film disposed directly on the inner or outer sidewalls of the first and the second isolation optical grid sections.

2. The split pixel cell of claim 1, further comprising a color filter layer disposed on the light-receiving surface of the semiconductor substrate, wherein the first and the second optical isolation grid sections separate the color filter layer into a plurality of color filters.

3. The split pixel cell of claim 1, further comprising a first and a second trench isolation structures disposed in the semiconductor substrate between the first photodiode and the second photodiode wherein the first and the second optical isolation grid sections are in general alignment with the first and the second trench isolation structure.

4. The split pixel cell of claim 1, wherein the light attenuation layer abuts against the inner sidewalls of the first and the second optical isolation grid sections.

5. The split pixel cell of claim 4, wherein the barrier film is disposed directly on the inner sidewalls of the first and the second optical isolation grid sections, and wherein the split pixel cell includes a second barrier film disposed directly on the outer sidewalls of the first and the second optical isolation grid sections.

6. The split pixel cell of claim 5, further comprising a buffer layer disposed over the first and the second optical isolation grid sections and the light attenuation layer, wherein the buffer layer is disposed directly on the top surfaces of the first and the second optical isolation grid sections.

7. The split pixel cell of claim 1, further comprising a passivation layer disposed directly on the light receiving surface of the semiconductor substrate, a section of the passivation layer is disposed between the first photodiode and the light attenuation layer.

8. The split pixel cell of claim 1, further comprising a plurality of photodiode regions wherein one of the photodiode regions included in the plurality of photodiode regions is configured as the first photodiode and remaining photodiode regions included in the plurality of photodiode regions are each configured as the second photodiode, wherein the second photodiode has a full well capacity larger than that of the first photodiode.

9. The split pixel cell of claim 8, wherein the remaining photodiode regions configured as the second photodiode are arranged to surround the photodiode region configured as the first photodiode.

10. The split pixel cell of claim 1, further comprising a color filter layer disposed on the light-receiving surface of the semiconductor substrate, wherein the first and the second optical isolation grid sections separate the color filter layer into a plurality of color filters,
wherein the light attenuation layer is underneath the first and the second optical isolation grid sections and abuts against the inner sidewalls of the first and the second optical isolation grid sections,
wherein the barrier film abuts against the entirety of the inner sidewalls and the outer sidewalls of the first and the second grid sections, and
wherein a buffer layer is further disposed directly over the barrier film and over the top surfaces of first and the second optical isolation grid.

11. The split pixel cell of claim 1, further comprising a color filter disposed between the first and the second optical isolation grid sections, wherein the barrier film is disposed between the first optical isolation grid section and the color filter, and wherein the barrier film is further disposed between the second optical isolation grid section and the color filter.

12. The split pixel of claim 1, wherein the light attenuation layer abuts the barrier film such that the barrier film is disposed between the inner sidewalls of the first or the second optical isolation grid sections and the light attenuation layer.

13. The split pixel of claim 12, wherein the barrier film is further disposed, at least in part, between the light receiving surface of the semiconductor substrate and at least one of the first or the second optical isolation grid sections.

14. The split pixel cell of claim 1, wherein the light attenuation layer is disposed underneath the first and the second optical isolation grid sections such that the attenuation layer is disposed, at least in part, between the first or the second optical isolation grid sections and the semiconductor substrate.

15. The split pixel of claim 1, where in the barrier film and the light attenuation layer each include a common material.

16. The split pixel of claim 15, wherein the common material includes titanium or titanium nitride.

17. A method for fabricating an image sensor, comprising:
providing a semiconductor substrate having a plurality of first photodiodes and a plurality of second photodiodes, wherein each of the first photodiodes are arranged to be surrounded by the second photodiodes, wherein each of the plurality of second photodiodes have greater sensitivity to incident light than the plurality of first photodiodes;
forming a light attenuation layer over a first surface of the semiconductor substrate, the light attenuation layer covering the first surface across the plurality of first photodiodes and the plurality of second photodiodes, wherein the first surface corresponds to a light receiving surface of the semiconductor substrate; thereafter forming an optical isolation grid structure over the semiconductor substrate, the optical isolation grid structure being disposed above and between each photodiode of the plurality of first photodiodes and the plurality of second photodiodes, the optical isolation grid structure defining a plurality of optical isolation grid sections each having a top surface and inner and outer sidewalls arranged to enclose a light exposure area of the plurality of first photodiodes, wherein the light attenuation layer is disposed adjacent to the inner sidewalls of the plurality of optical isolation grid sections and in optical alignment with the plurality of first photodiodes; thereafter removing sections of the light attenuation layer over the plurality of second photodiodes, thereby leaving first photodiode sections of the light attenuation layer solely over the plurality of first photodiodes such that the light attenuation layer is in optical alignment with the plurality of first photodiodes, and wherein the light attenuation layer is structurally connected with a first and a second optical isolation grid sections included in the plurality of optical isolation grid sections covering the light exposure area of a first photodiode included in the plurality of first photodiodes;

forming a barrier film disposed directly on the inner or outer sidewalls of the plurality of optical isolation grid sections; and forming a buffer layer over the optical isolation grid structure and the first photodiode sections of the light attenuation layer, wherein the buffer layer is disposed directly on the top surfaces of the optical isolation grid sections.

18. The method of claim 17, wherein said forming an optical isolation grid structure over the semiconductor substrate includes depositing a sacrificial material layer on the light attenuation layer;

forming openings in the sacrificial material, the openings positioned above and between each photodiode of the plurality of first photodiodes and the plurality of second photodiodes;

depositing optical isolation grid material into the openings; and removing the sacrificial material layer.

19. The method of claim 18, wherein said forming an optical isolation grid structure over the semiconductor substrate further includes depositing a barrier film material on sidewalls and a bottom of the openings prior to deposition of the optical isolation grid material to form the barrier film.

20. The method of claim 18, further comprising, prior to said forming the light attenuation layer over the first surface of the semiconductor substrate, forming a passivation layer on the first surface of the semiconductor substrate, wherein the openings extend toward the first surface of semiconductor substrate directly adjacent the passivation layer.

21. The method of claim 18, wherein the openings extend into the passivation layer a depth D.

22. The method of claim 17, wherein the semiconductor substrate includes a deep isolation trench structure disposed between each photodiode of the plurality of first photodiodes and each of the plurality of second photodiodes, wherein the plurality of optical isolation grid sections are in optical alignment with the deep trench isolation structure.

* * * * *

UNITED STATES PATENT AND TRADEMARK OFFICE
CERTIFICATE OF CORRECTION

| | |
|---|---|
| PATENT NO. | : 11,647,300 B2 |
| APPLICATION NO. | : 17/247321 |
| DATED | : May 9, 2023 |
| INVENTOR(S) | : S. Mun |

It is certified that error appears in the above-identified patent and that said Letters Patent is hereby corrected as shown below:

In the Claims

| Column | Line | Claim | |
|---|---|---|---|
| 15 | 37 | 1 | change "second isolation optical grid" to -- second optical isolation grid -- |
| 15 | 40 | 2 | change "light-receiving" to -- light receiving -- |
| 15 | 49 | 3 | change "structure" to -- structures -- |
| 16 | 4 | 8 | change "wherein one of the photodiode regions" to -- wherein a photodiode region -- |
| 16 | 16 | 10 | change "light-receiving" to -- light receiving -- |
| 16 | 26 | 10 | change "second grid" to -- second optical Isolation grid -- |
| 16 | 28 | 10 | change "of first and the second optical isolation grid" to -- of the first and the second optical isolation grid sections -- |
| 16 | 48 | 14 | change "the attenuation layer" to -- the light attenuation layer -- |
| 16 | 52 | 15 | change "where in the" to -- wherein the -- |
| 18 | 23 | 20 | change "of semiconductor" to -- of the semiconductor -- |
| 18 | 28 | 22 | change "deep isolation trench structure" to -- deep trench isolation structure -- |

Signed and Sealed this
Thirteenth Day of June, 2023

*Katherine Kelly Vidal*

Katherine Kelly Vidal
*Director of the United States Patent and Trademark Office*